(12) United States Patent
Passe et al.

(10) Patent No.: US 7,279,963 B2
(45) Date of Patent: Oct. 9, 2007

(54) LOW INDUCTANCE SEMICONDUCTOR DEVICE HAVING HALF-BRIDGE CONFIGURATION

(75) Inventors: Thomas Passe, Hagen-Breckerfeld/Epscheidt (DE); Oliver Schilling, Warstein (DE)

(73) Assignee: eupec Europäische Gesellschaft für Leistungshalbleiter mbH (DE)

( * ) Notice: Subject to any disclaimer, the term of this patent is extended or adjusted under 35 U.S.C. 154(b) by 2 days.

(21) Appl. No.: 11/143,398

(22) Filed: Jun. 2, 2005

(65) Prior Publication Data

US 2006/0001146 A1 Jan. 5, 2006

(30) Foreign Application Priority Data

Jun. 3, 2004 (DE) ............... 10 2004 027 185

(51) Int. Cl.
  H01L 23/58 (2006.01)
  H01L 23/50 (2006.01)
  H01L 27/092 (2006.01)
(52) U.S. Cl. ..................... 327/566; 327/437
(58) Field of Classification Search ........... None
  See application file for complete search history.

(56) References Cited

U.S. PATENT DOCUMENTS

| | | | |
|---|---|---|---|
| 4,907,068 A | 3/1990 | Amann et al. ............ 257/724 |
| 5,202,578 A * | 4/1993 | Hideshima ................ 257/685 |
| 5,616,955 A * | 4/1997 | Yamada et al. .......... 257/690 |
| 6,642,576 B1 * | 11/2003 | Shirasawa et al. ....... 257/328 |
| 6,885,096 B2 * | 4/2005 | Hirahara et al. .......... 257/692 |
| 6,906,404 B2 * | 6/2005 | Maly et al. ............... 257/678 |

FOREIGN PATENT DOCUMENTS

| | | |
|---|---|---|
| EP | 0277546 B1 | 6/1992 |
| JP | 2004031590 | 1/2004 |

* cited by examiner

Primary Examiner—Kenneth B. Wells
Assistant Examiner—Terry L. Englund
(74) Attorney, Agent, or Firm—Coats & Bennett, P.L.L.C.

(57) ABSTRACT

A semiconductor device has first, second, and third connecting leads (1, 2, 3), whose respective base points (1f, 2f, 3f) have centroids (1m, 2m, 3m). The connecting leads are arranged wherein an angle (α) between a first line drawn between the centroids (1m, 3m) of the base points (1f, 3f) of first lead (1) and third lead (3) and a second line drawn between the centroids (2m, 3m) of the base points (2f, 3f) of second lead (2) and third lead (3) is 20° maximum. In addition, a semiconductor module may incorporate two or more semiconductor devices which are connected electrically in parallel.

20 Claims, 5 Drawing Sheets

FIG 8 Section A-A
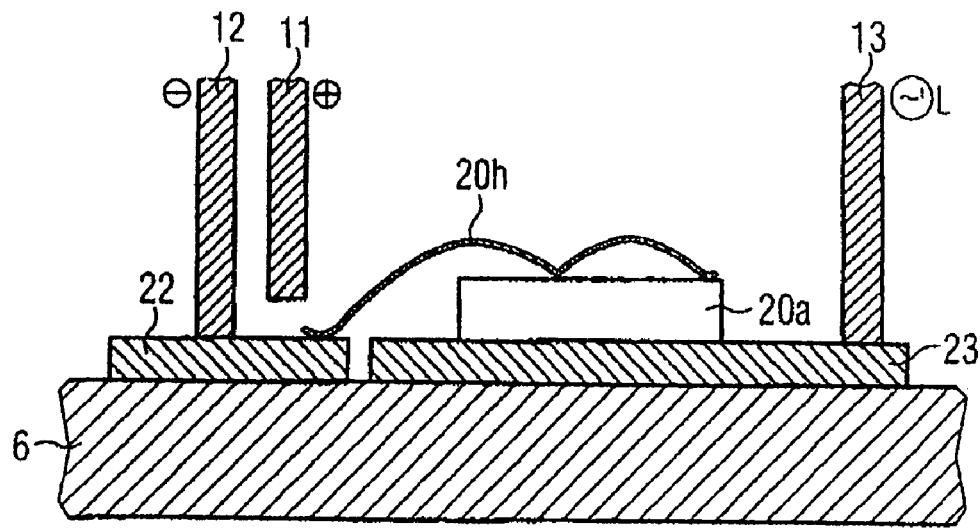
FIG 9
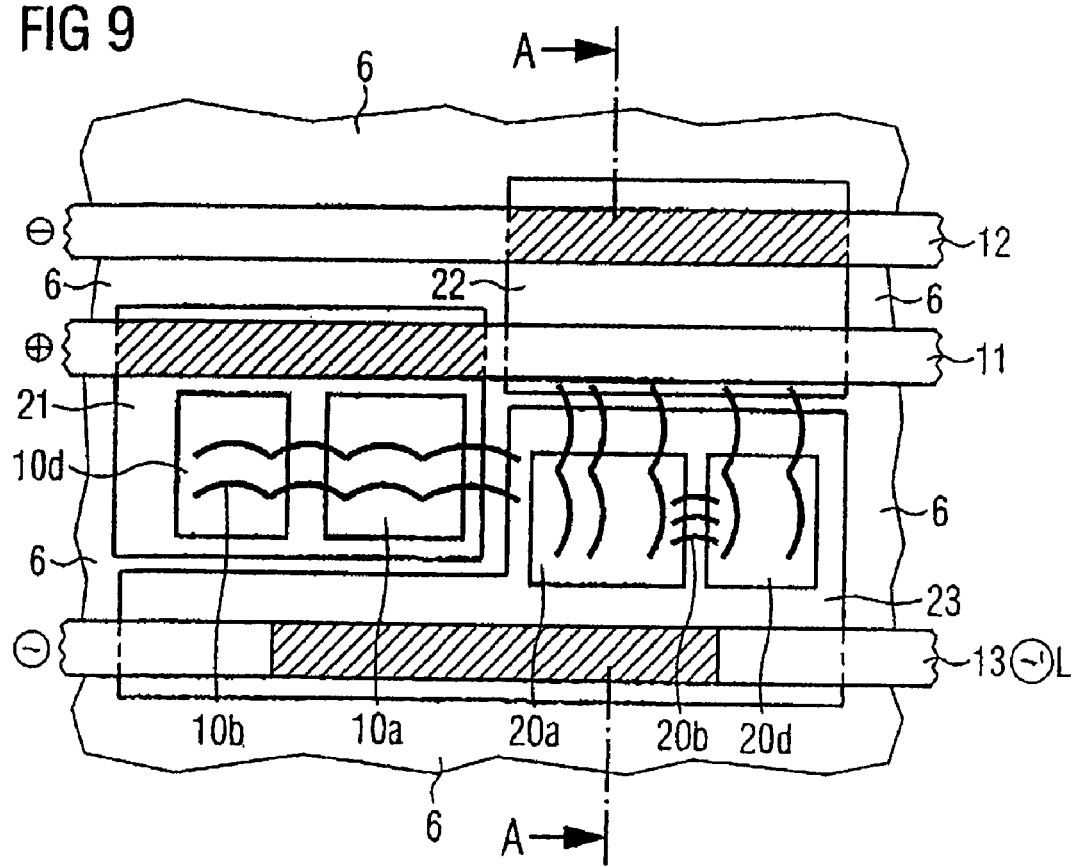

LOW INDUCTANCE SEMICONDUCTOR DEVICE HAVING HALF-BRIDGE CONFIGURATION

CROSS-REFERENCE TO RELATED APPLICATION

This application claims priority from German Patent Application No. 10 2004 027 185.2-33, which was filed on Jun. 3, 2004, and is incorporated herein by reference in its entirety.

TECHNICAL FIELD

The invention relates to a semiconductor device and a semiconductor module having half-bridge configuration.

BACKGROUND

Such semiconductor devices or semiconductor modules implemented with such semiconductor devices are used for example, when high currents must be controlled, regulated or above all switched. In order to minimize switching losses in this case, fast-switching semiconductor devices such as IGBTs, MOSFETs or high-speed diodes are often used. The magnitude of the differential current change over time that occurs here can assume very large values. Since the voltage induced in a conductor is proportional to the product of its inductance and the change over time of the current flowing through it, the voltage induced in the conductor can assume large values.

Voltage peaks arise in practice that can load and sometimes even destroy the semiconductor devices.

Thus one usually tries to design such semiconductor devices so that such voltage peaks can be kept as low as possible.

A semiconductor arrangement having two connecting leads is known from EP 0 277 546 A1 in which a low inductance design is achieved by arranging the connecting leads close together and parallel to each other, at least in parts. The circuit arrangement is still not optimized, however, with regard to the configuration of a half-bridge used in practice.

Circuit arrangements as described in EP 0 277 546 A1 are often combined into half-bridge or full-bridge modules, for example, in order to drive high loads such as motors, inverters or the like.

Connecting together two or more of such semiconductor arrangements creates further parasitic inductances (stray inductances) that can also result in unwanted voltage peaks.

SUMMARY

Thus it is the object of the present invention to present a semiconductor device and a semiconductor module of the type cited in the introduction whose design exhibits a reduced stray inductance compared with the state of the art.

This object can be achieved by a semiconductor device comprising a first and a second element of a half-bridge, which are arranged on a common substrate having tracks, and having a first, a second and a third connecting lead, wherein the first element of the half-bridge comprises at least a first semiconductor element and a first freewheeling component, the second element of the half-bridge comprises at least a second semiconductor element and a second freewheeling component, the first connecting lead is connected by an electrically conducting connection to the first semiconductor element and the second connecting lead to the second semiconductor element, the first and the second connecting lead are used for DC supply and are arranged parallel to each other, at least in parts, the third connecting lead constitutes a load terminal of the half-bridge, the first, second and third connecting lead each have a base point facing the substrate, and wherein the connecting line between centroids of the base points of the first and third connecting lead, and the connecting line between the centroids of the base points of the second and third connecting lead enclose an angle of 20° maximum.

The connecting line of the centroids of the first semiconductor element and the first freewheeling component, and the connecting line of the centroids of the second semiconductor element and the second freewheeling component may enclose an angle of 20° maximum. The first connecting lead may enclose the second connecting lead, at least in parts, in an angle of at least 180°. The first connecting lead and the second connecting lead can be arranged, at least in parts, at least approximately coaxially with each other. At least one of the connecting leads may have a planar design. The distance between the first and the second connecting lead can be less than 3.0 mm. At least one of the semiconductor elements can be designed as an IGBT or a MOSFET. Part of the third connecting lead can be sandwiched between the first and the second semiconductor element, and can be electrically connected to them by an electrically conducting connection.

A semiconductor module may have at least one first and one second semiconductor device as described above, which are arranged on a common substrate and connected electrically in parallel. The first and second connecting leads of the first and second semiconductor devices run parallel to each other, at least in parts. The two first connecting leads and the two second connecting leads form a pair in each case, the pairs are arranged crosswise, and the connecting leads of the same pair have the same polarity. Such a semiconductor device may comprise at least one first, second and third conducting rail for connecting the semiconductor devices electrically in parallel, wherein the connecting leads and/or electrical connections required for the parallel circuit are implemented by the at least one first, second and third conducting rail. At least the first and second conducting rail may run parallel to each other. The third conducting rail may run parallel to the first and second conducting rails, and the semiconductor element can be arranged between the third conducting rail and the pair of the first and the second conducting rails.

The semiconductor device according to the invention comprises two elements connected together into a half-bridge, plus a first, a second and a third connecting lead, wherein each of the elements of the half-bridge comprises at least one, preferably controllable, semiconductor element. The base points of the connecting leads are arranged such that the current paths of the current from the base point of the first to the third connecting lead runs as parallel as possible to the current path of the current from the base point of the second to the third connecting lead, and preferably their directions do not differ from each other by more than 20°. Such an arrangement means that the current direction barely changes in a switchover process typical of a half-bridge, and the change in the magnetic field around the switching arrangement is thereby minimized during the switchover. The geometrical area in which non-negligible changes in the magnetic field occur is reduced to the inside of the circuit arrangement by the arrangement according to the invention. Thus the stray inductance of the design and hence the whole semiconductor device, which acts during the switchover process, is also reduced.

A further reduction in the stray inductance can be achieved by keeping the distance between the current path from the first to the third connecting lead and the current path from the third to the second connecting lead as short as possible. Here one must ensure that the distance is not less than the separation required for sufficient insulation reliability.

The points considered so far are relevant in practice primarily to the substrate plane. In addition, external contacts to such semiconductor devices are made using connecting leads. The connecting leads normally rise significantly above the substrate plane. Since they also make a not insignificant contribution to the overall inductance of the semiconductor device, an advantageous positioning of the connecting leads is crucial if minimum possible stray inductances are to be achieved.

This applies in particular to the first and second connecting lead, which are provided for connecting the power supply. In order to achieve a minimum possible overall stray inductance it is advantageous if the first and the second connecting lead are arranged in parallel, at least in parts, and at a short distance apart. In addition, a reduction in the stray inductance of a semiconductor device or a semiconductor module can also be achieved by the connecting leads having a planar design.

In a preferred embodiment, the first connecting lead encloses the second connecting lead, at least in parts, in an angle of at least 180°.

In this case it is particularly preferred that the first and the second connecting lead are arranged, at least in parts, at least approximately coaxially with each other.

In principle any semiconductor elements are used in the semiconductor device. Fast-switching, high-voltage proof and controllable semiconductor devices such as IGBTs or MOSFETs are preferably used however.

The semiconductor device according to the invention can comprise other active or passive electronic components in addition to the semiconductor elements. In particular when inductive loads are being switched with such semiconductor devices, it is advantageous to provide the relevant elements of the half-bridge of a semiconductor device with diodes or other freewheeling components that protect the semiconductor devices from induction voltages on the load side by their acting as freewheeling diodes or as components that permit freewheeling operation.

In another version of the semiconductor device according to the invention, a part of the third connecting lead is sandwiched between the first and the second semiconductor element. The dimension of the interconnect required for connecting the first element of the half-bridge to the second element of the half-bridge of a semiconductor device is minimized in this way. This interconnect consists in the part of the third connecting lead used for the sandwich-type construction.

In this version the third connecting lead is preferably connected directly by an electrically conducting connection to the first and to the second semiconductor element.

In order to connect certain components of the semiconductor device together electrically, the substrate is provided with tracks. The tracks can have both an elongated and a planar form.

In a semiconductor device according to the invention, at least two elements of a half-bridge are combined in a unit.

In order to achieve a higher current-carrying capacity, it is advantageous to arrange two or more semiconductor elements and/or semiconductor devices on a common substrate and connect them electrically in parallel. In order to keep as low as possible the parasitic inductances created by the arrangement of two or more semiconductor devices on the common substrate, it can be advantageous to take into account certain design rules when using the semiconductor devices.

For certain configurations, it is advantageous if at least the first and second connecting lead of a semiconductor device is arranged at its edge. This creates the possibility of arranging two such semiconductor devices adjacent to each other in such a way that their first and second connecting leads lie close beside each other and thus form a group of four. It is particularly advantageous in this case if the connecting leads of this group of four run parallel to each other, at least in parts.

A further advantage with regard to avoiding parasitic inductances results if the pair of the first connecting leads and the pair of the second connecting leads are arranged crosswise.

In order to increase the current-carrying capacity of a semiconductor module according to the invention, two or more semiconductor devices can be connected electrically in parallel. It is also possible to connect electrically in series two or more semiconductor devices of a semiconductor module. Metal conducting rails are suitable for making the electrical connections between semiconductor devices connected together, each of the metal conducting rails connecting the terminals to be connected together of the semiconductor devices. In the case of a parallel circuit, the first, second and third connecting leads of the semiconductor devices concerned are in each case connected together by conducting rails.

The conducting rails also create parasitic inductances on the semiconductor module according to the invention. These inductances can be minimized by at least the first and the second conducting rail running parallel to each other at a short distance apart.

An arrangement is particularly preferred in which the third conducting rail runs parallel to the first and second conducting rail, and in which the semiconductor element is arranged between the third conducting rail and the pair of the first and second conducting rail, the third conducting rail preferably constituting the load terminal of the semiconductor module.

BRIEF DESCRIPTION OF THE DRAWINGS

The invention is presented below with reference to exemplary embodiments and described in greater detail in drawings, in which FIG. 8 shows a vertical section through the semiconductor module of FIG. 7, and FIG. 9 shows in plan view the segment of the semiconductor module according to the invention of FIGS. 7 and 8.

In the figures, the same references are used for the same parts with the same meaning.

DETAILED DESCRIPTION

Figure 1:
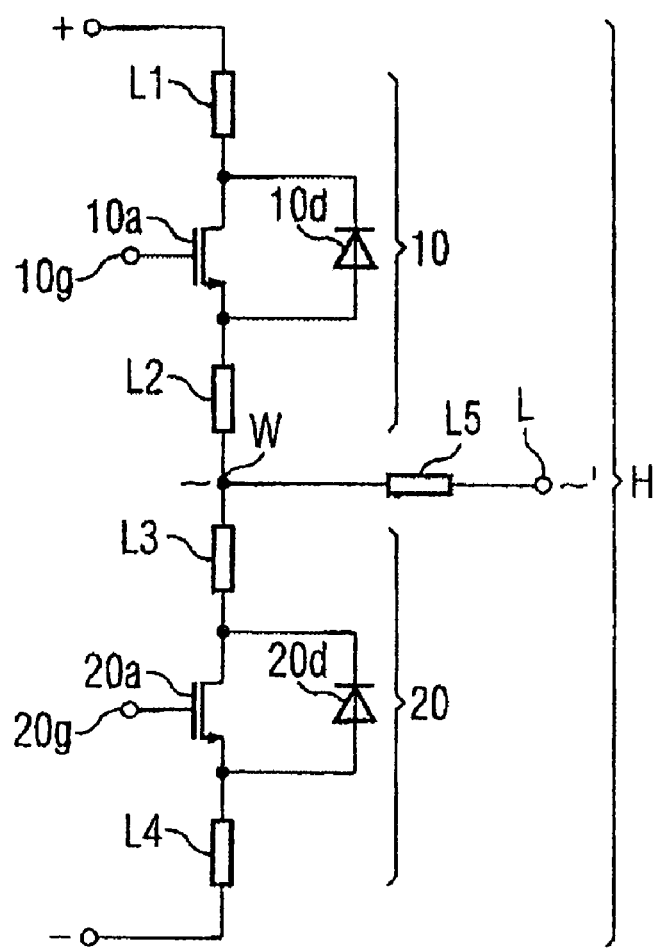
FIG. 1 shows an equivalent circuit diagram of a half-bridge with equivalent inductances.

FIG. 1 shows the circuit diagram of a semiconductor device designed as a half-bridge H. The half-bridge H comprises an upper element 10 (high-side) and a lower element 20 (lowside). Each of the elements 10, 20 of the half-bridge H comprises essentially a semiconductor element 10a and 20a respectively. The two semiconductor elements 10a, 20a of the half-bridge H are connected in series and designed as IGBTs or MOSFETs for example. The semiconductor elements 10a, 20a preferably have gate terminals 10g, 20g by means of which they are driven such that one of the semiconductor elements 10a, 20a conducts while the other semiconductor element 20a, 10a is cut off. When switching between these two states, a potential change occurs at the point W at which the two semiconductor elements 10a, 20a are connected together. Thus this point W is also referred to as the point of changing potential.

A freewheeling diode 10d and 20d respectively is connected in parallel with the load paths of the semiconductor elements 10a, 20a and reversed biased with respect to the polarity of the supply voltage applied across the half-bridge.

The point of changing potential W is arranged preferably in or at least near the plane in which the semiconductor elements 10a, 20a and/or the free-wheeling diodes 10d, 20d are also located.

In addition, a load terminal L for connecting an external load is connected with an electrically conducting connection to the point of changing potential.

All connecting leads and interconnects of an electrical circuit have parasitic inductances which are particularly undesirable when rapidly changing currents flow via these conductors because these currents generate high induction voltages that can load, damage or destroy the semiconductor elements 10a, 20a, 10d, 20d or other components of the semiconductor device.

Each of the parasitic inductances inherent in the connecting leads and interconnects of the circuit are each represented symbolically by equivalent inductances L1 to L5.

Figure 2:
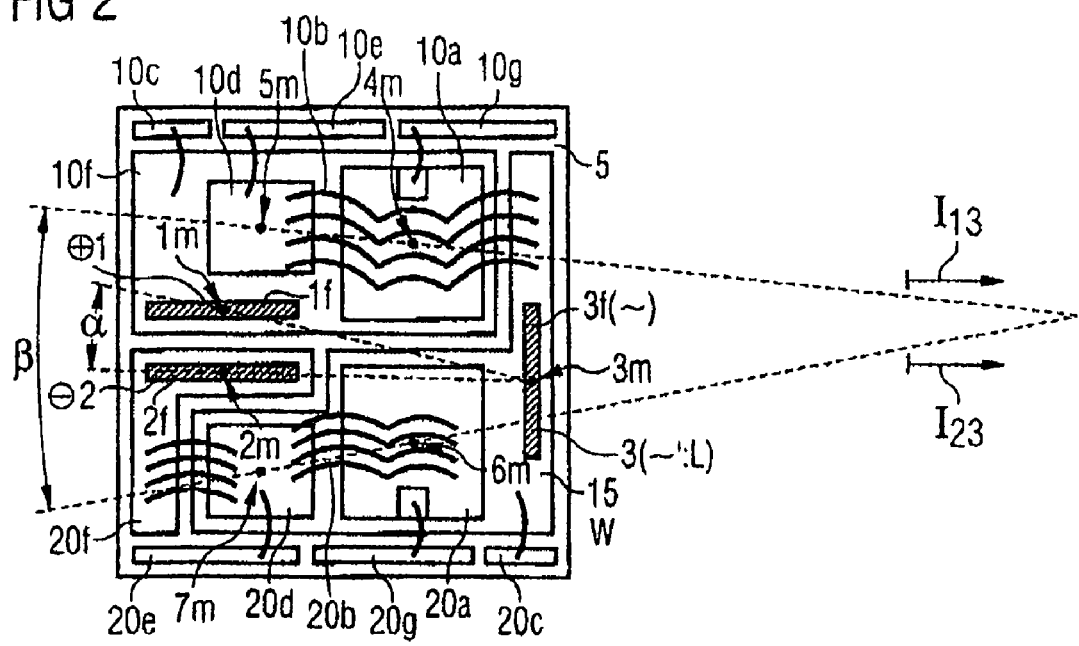
FIG. 2 shows in plan view a semiconductor device according to the invention having two elements of a half-bridge.

FIG. 2 shows in plan view a semiconductor device according to the invention having a half-bridge. The semiconductor device comprises a half-bridge having a first and a second element 10, 20, which are connected together as shown in the circuit of FIG. 1. The first element 10 comprises a semiconductor element 10a designed as an IGBT for example and a freewheeling diode 10d. The second element 20 correspondingly comprises a semiconductor element 20a designed as an IGBT for example and a freewheeling diode 20d.

In addition, gate terminals 10g, 20g, auxiliary collector terminals 10c, 20c and auxiliary emitter terminals 10e, 20e are provided in order to make external contact with the semiconductor device. Electrical connections between these elements are implemented by tracks 10f, 20f and by bonding wires 10b, 20b.

All these components are arranged on a substrate 5 having tracks 10f, 20f, 15, and together with this form the semiconductor device.

A first 1, a second 2 and a third 3 connecting lead are provided in order to make external contact with the semiconductor device. All three connecting leads 1, 2, 3 preferably have a planar design, and each make contact with one of the tracks 10f, 20f, 15 respectively.

The first and second connecting lead 1, 2 are used for the power supply to the semiconductor device, where the first connecting lead 1 is connected to the positive terminal "+" and the second connecting lead 2 to the negative terminal "−" of an external power supply applied across the half-bridge. The third connecting lead 3 is provided for connecting an external load.

Each of the first, second and third connecting leads 1, 2 and 3 have, facing the substrate 5, a base point 1f, 2f and 3f respectively, on which the connecting lead 1, 2, 3 makes contact with one of the tracks 10f, 20f, 15.

In a typical operating state, such a half-bridge has two switching states in which one of the two semiconductor elements at any one time is driven on while the other is cut off.

For example, if the semiconductor element 20a is cut off in the one switching state, then with a semiconductor element 10a driven on, a load current results between the base point 1f of the first connecting lead 1 and the base point 3f of the third connecting lead 3, assuming a load is connected to the third connecting lead 3.

One needs to pay particular attention here to switchover processes in a semiconductor element 10a, 20a, in particular when a semiconductor element driven in the on state and with a load current flowing through it is switched off. This is explained below for the semiconductor element 10a by way of example.

The starting situation for the explanation is the semiconductor element 10a, with a load connected to the third connecting lead 3 of the half-bridge. The load path of the semiconductor element 10a is driven on so that the load current follows a current path from the base point 1f of the first connecting lead 1 via the load path to the base point 3f of the third connecting lead 3, resulting in a main current direction I13, which is defined by the base points of the first 1 and third 3 connecting lead.

After switching off the semiconductor element 10a, a load current is set up by commutation that has a current path that runs from the base point 2f of the second connecting lead 2 via the freewheeling diode 20d to the base point 3f of the third connecting lead 3, resulting in a main current direction I23, which is defined by the base point of the second 2 and third 3 connecting lead.

In order to keep the parasitic inductances acting in the moment of commutation as low as possible in the semiconductor device, the two current paths I13 and I23 must run as parallel as possible to each other and at a smallest possible distance apart. One must ensure here that the distance is not less than the separation required for maintaining the insulation. The insulation strength can be increased particularly for short separations by introducing a suitable dielectric, for example a potting compound, in the space between the components to be insulated from each other.

In order to achieve as parallel a course as possible for the current paths I13 and I23 it is provided according to the invention that the connecting line between the centroids 1m and 3m of the base points 1f and 3f of the first and third connecting lead 1 and 3 respectively and the connecting line between the centroids 2m and 3m of the base points 2f and 3f of the second and third connecting lead 2 and 3 respectively enclose an angle α of 20° maximum.

Here the term centroid of a surface area F(x,y) means the point with coordinates (xs, ys) for which the following holds:

$$xs = \frac{1}{F}\int_F x \cdot dF \quad \text{and} \quad ys = \frac{1}{F}\int_F y \cdot dF$$

The basis for the calculation of the centroid (xs, ys) of the base point 1f, 2f, 3f of a connecting lead 1, 2, 3 is here the surface area F(x, y) with which the base point 1f, 2f, 3f concerned makes electrically conducting contact with its respective track 10f, 20f and 15.

In addition, it is advantageous if the connecting line of the centroids 4m, 5m of the semiconductor element 10a and the freewheeling diode 10d and the connecting line of the centroids 6m, 7m of the semiconductor element 20a and the freewheeling diode 20d enclose an angle β of 20° maximum.

Corresponding to the calculation of the centroid of the base points 1f, 2f, 3f, the basis for the calculation of the centroids 4m, 5m, 6m, 7m of the semiconductor elements 10a, 10d, 20a, 20d is the surface area F(x, y) with which the semiconductor element 10a, 10d, 20a, 20d concerned makes electrically conducting contact with its respective track 10f, 10f, 15w and 15w.

Based on similar considerations, the connecting leads 1, 2 provided for the power supply are arranged parallel to each other and at a minimum possible separation that is preferably less than 3.0 mm.

A further reduction in the parasitic inductances can be achieved by the point W of the changing potential, which in this exemplary embodiment is located on the track 15, being arranged in the same plane as the semiconductor elements 10a, 20a as far as possible or at least at only a small distance from this plane.

Figure 3A:
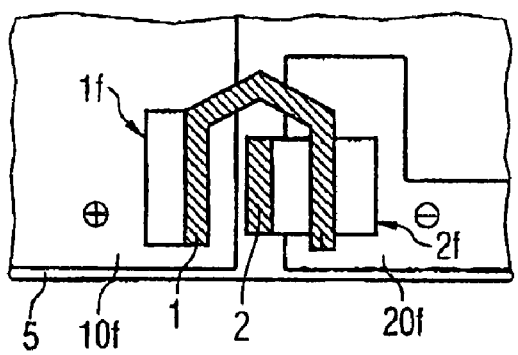
FIG. 3a shows in plan view two connecting leads running parallel to each other for the power supply of a semiconductor device according to the invention.
Figure 3B:
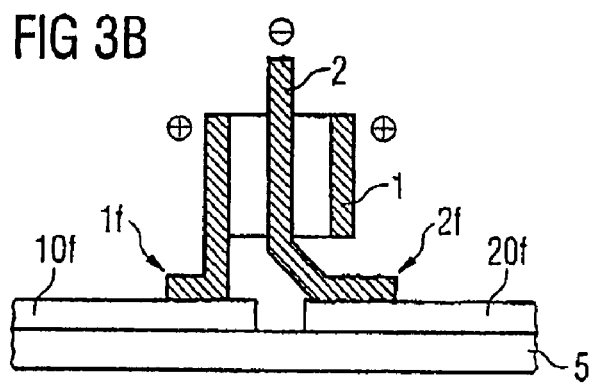
FIG. 3b shows in cross-section the connecting leads shown in FIG. 3a for the power supply running parallel to each other.

A preferred embodiment concerning the relative arrangement of the first with respect to the second connecting lead 1, 2 is shown in the FIGS. 3a and 3b. FIG. 3a shows a plan view of the relevant segment of a semiconductor device, while FIG. 3b shows a vertical section through the same segment.

The first and second connecting lead 1 and 2 are connected by their base points 1f and 2f to tracks 10f and 20f respectively, which are arranged on a substrate 5. Both connecting leads 1, 2, except for the base points 1f, 2f facing the substrate 5, run parallel and approximately coaxially, with the first connecting lead 1 enclosing the second connecting lead (2) in an angle of more than 180°.

Figure 4:
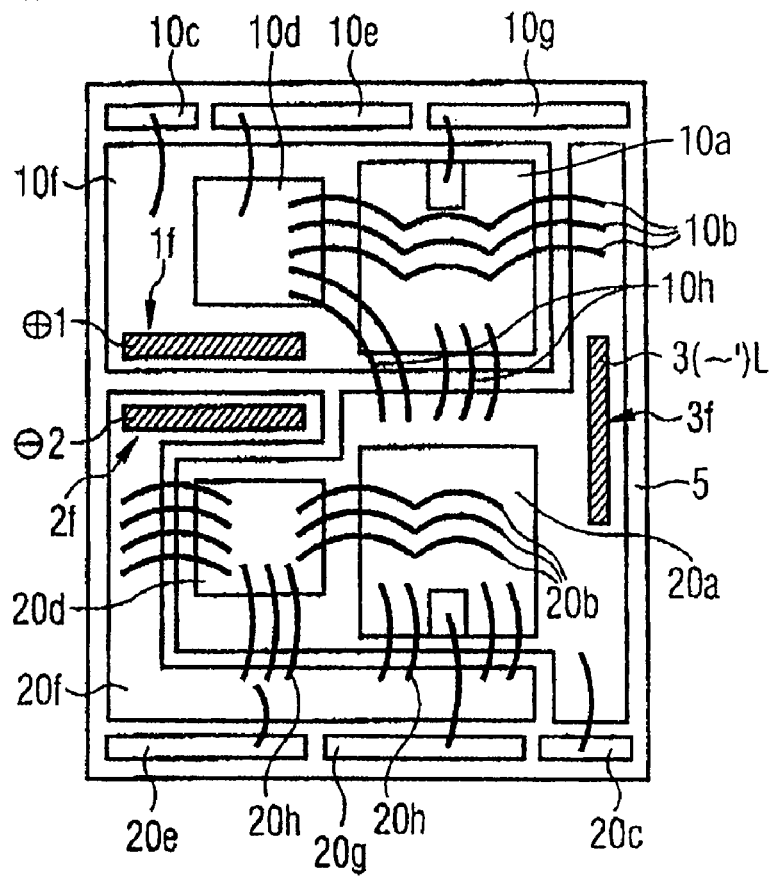
FIG. 4 shows in plan view the semiconductor device according to the invention shown in FIG. 2, in which the bonding wires that connect the semiconductor devices and the freewheeling diodes together and to the input/output devices run in markedly different directions.

A further measure for reducing the overall inductance of a semiconductor device is shown in the semiconductor device of FIG. 4. The basic design of this semiconductor device corresponds to the semiconductor device of FIG. 2. The essential difference to this lies in the more planar bonding of the semiconductor elements 10a, 20a and the freewheeling diodes 10d, 20d. This is achieved by the bonding wires 10b, 20b not lying in a preferred direction but having different directions distributed as equally as possible. In order to show this clearly, extra bonding wires 10h, 20h running in a clearly different direction to the bonding wires 10b, 20b have been added compared to the semiconductor device of FIG. 2.

In certain applications it is advantageous to arrange two or more semiconductor elements on a substrate so as to create a semiconductor module according to the invention. Complex circuit structures can be implemented in this way. In particular, the current carrying capability can be increased by connecting together in parallel two or more semiconductor devices.

Figure 5:
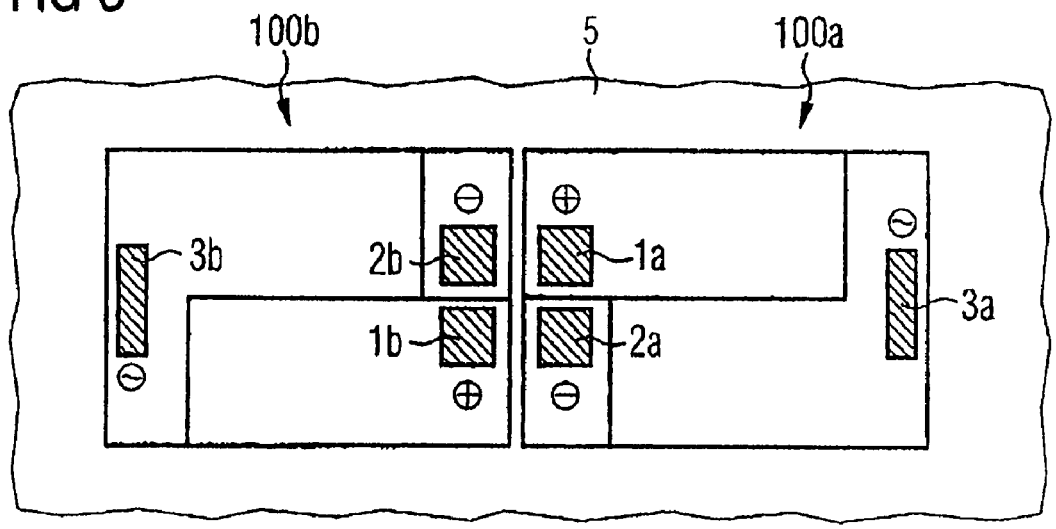
FIG. 5 shows in plan view a semiconductor module according to the invention having two semiconductor devices arranged on a common substrate, wherein the first connecting leads and the second connecting leads are respectively arranged crosswise.

The segment of such a semiconductor module is shown in FIG. 5. Two semiconductor devices 100a and 100b are arranged on a common substrate 5. It can have the same design, for example, as the design shown in the FIG. 2 or 4 and it can be electrically connected in the same way as the circuit shown in FIG. 1. For reasons of clarity, only the first 1a, 1b, the second 2a, 2b and the third 3a, 3b connecting leads of the semiconductor elements 100a, 100b are shown. In addition, tracks in the form of metallizations of the substrate 5 are indicated schematically without showing the gaps necessary for isolation between different tracks.

The semiconductor devices 100a, 100b are arranged adjacently on the common substrate 5 such that their first 1a, 1b and their second 2a, 2b connecting leads are positioned in each case near to the edge of the semiconductor device 100a, 100b facing the other semiconductor element 100b, 100a. The first and second connecting leads 1a, 1b, 2a, 2b thereby form a group of four. In addition, the connecting leads 1a, 1b, 2a, 2b of the group of four run mainly parallel. They have a very small separation, where the distance must not be less than the minimum separation required for maintaining the insulation strength.

It is particularly advantageous if the crosswise-arranged first and second connecting leads 1a, 1b, 2a, 2b of this group of four each have the same polarity. In this case, the changes in the magnetic field induced by the change in load currents over time compensate each other at least in parts.

Figure 6:
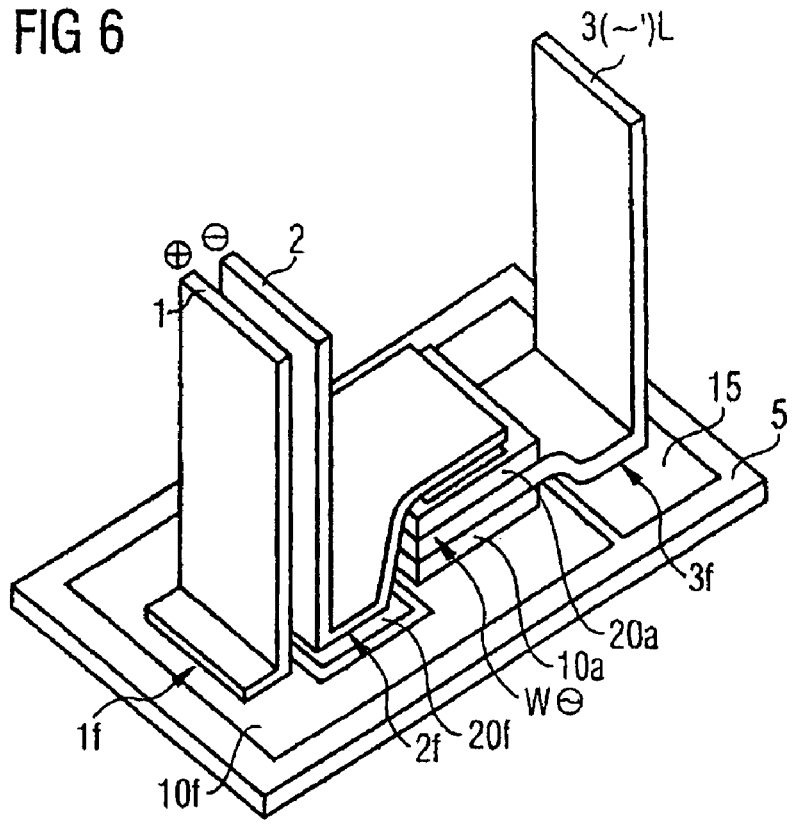
FIG. 6 shows in perspective view a semiconductor device according to the invention in which part of the third connecting lead is sandwiched between two semiconductor elements.

FIG. 6 shows in perspective view a preferred exemplary embodiment of a semiconductor device comprising a half-bridge. Mutually independent tracks 10f, 20f, 15 are arranged on a substrate 5. The tracks 10f, 20f, 15 have a planar design. All three connecting leads 1, 2, 3 also have a planar design and run substantially parallel. Each connecting lead 1, 2 and 3 has on its side facing the substrate 5 a base point 1f, 2f and 3f respectively, which makes electrical contact with exactly one of the track surfaces 10f, 20f and 15 respectively. The first and the second connecting lead 1, 2 are provided for connecting an external power supply. In order to keep their inductance as low as possible, their separation is chosen to be as low as possible without being less than the minimum separation required for a sufficient insulation strength.

A segment or an end of the third connecting lead 3 is sandwiched between two semiconductor elements 10a, 20a. Both semiconductor elements 10a, 20a have a planar design. On its side facing the substrate, the semiconductor element 20a of the lower element (lowside) of the half-bridge makes electrically conducting contact with the second connecting lead 2. The semiconductor element 10a is assigned to the upper element (highside) of the half-bridge, and on its side facing the substrate makes electrically conducting contact with the base point 1f of the first connecting lead 1 indirectly via the track 10f. One end of the third connecting lead 3 is provided for connecting an external load.

The particularly low overall inductance of this semiconductor device is based in particular on the short length of the interconnect between the semiconductor elements 10a and 20a. The inductance of this interconnect equals the sum of the equivalent inductances L2 and L3 of FIG. 1 and is negligible in this circuit arrangement.

In this type of design, most of the heat arising in the semiconductor elements 10a, 20a must be dissipated via the connecting leads 2 and 3. These are therefore designed to have a good thermal conductance and are also in good thermal contact both with the respective metallizations 20f or 15, and with the semiconductor elements 20a and 10a.

In addition, the connection leads 1 and 2 provided for the power supply are also arranged at a short distance apart in this exemplary embodiment.

Figure 7:
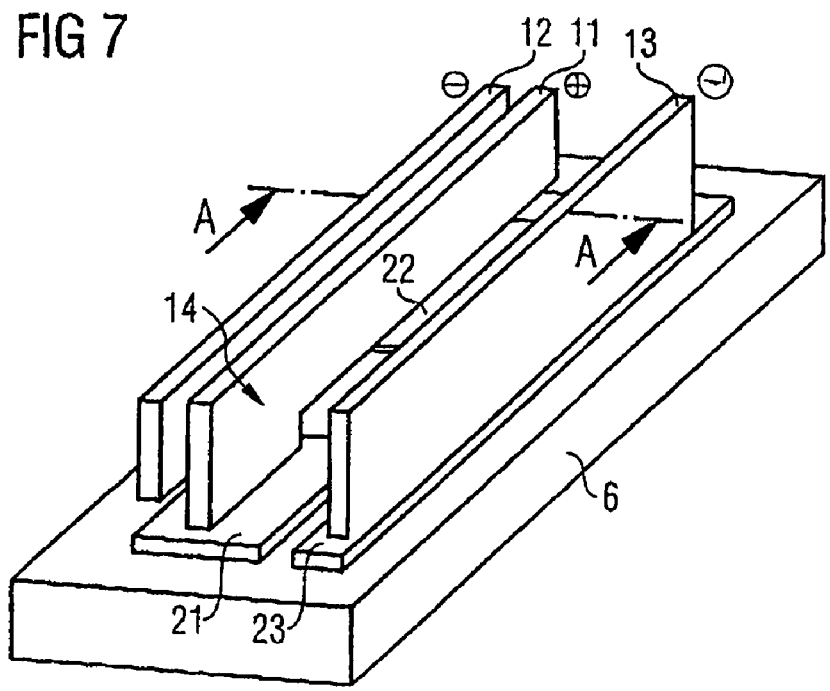
FIG. 7 shows at an inclined angle α segment of a semiconductor module according to the invention having parallel positioned conducting rails.

In a semiconductor module it is usually required to connect electrically certain terminals of individual semiconductor devices to terminals of other semiconductor devices or to other electronic components belonging to the same semiconductor module. This can be implemented particularly easily using conducting rails. FIG. 7 shows an exemplary embodiment of this. A substrate 6 has areas of metallization 21, 23 and can be designed as a DCB substrate (DCB=Direct Copper Bonding) for example. The substrate 6 can be identical to the substrate 5 of FIGS. 2 to 4. The metallizations 21, 23 are used to provide both mechanical fixing and electrical contact for electrical and/or mechanical components, for example by soldering or welding on.

The arrangement shown in FIG. 7 shows a segment of a semiconductor module according to the invention and has first 11, second 12 and third 13 conducting rails, each rectangular in shape, which extend parallel to each other and perpendicular to the surface of a substrate 6. The conducting rails 11, 12, 13 connect a plurality of semiconductor elements 10a, 20a arranged between, beneath or beside the conducting rails 11, 12 and 13, and not visible in this view, and other semiconductor components lying outside the segment shown.

The conducting rails 11, 12, 13 can lie, like the conducting rail 13 for example, on a metallization, here the metallization 23, over their entire length. It is also possible, however, that, like the first conducting rail 11 in the present exemplary embodiment, an electrical and/or mechanical connection to a metallization, in this case the metallization 21, and possibly to other metallizations, only exists along part of their length. The conducting rail can have a step 14 for this purpose, as does the first conducting rail 11 in the example. In this way it is possible to cross over metallizations, tracks or other conducting rails without making electrical contact with them.

The conducting rails 11, 12, 13 are arranged parallel to each other, where the distance between the first 11 and second 12 conducting rail used for the power supply is chosen to be as short as possible without being less than the separation required for a sufficient insulation.

The diagram in FIG. 8 shows a vertical cross-section through the conducting rail arrangement of FIG. 7. The substrate 6 has mutually independent metallizations 22, 23. A semiconductor element 20a is arranged on the metallization 23, and is electrically connected to the metallization 23 directly and to the metallization 22 via bonding wires 20h. In addition, the metallizations 22, 23 are electrically connected to the conducting rails 12, 13. The first conducting rail 11 crosses over the metallization 22 without making contact with this. In this view the short distance between the first conducting rail 11 and the second conducting rail 12 is clearly visible.

FIG. 9 shows a plan view of the segment shown in the FIGS. 7 and 8 of a semiconductor module according to the invention. The substrate 6 has mutually independent metallizations 21, 22, 23. Semiconductor elements 10a and 20a and freewheeling diodes 10d and 20d are arranged on the metallizations 21 and 23 respectively. The semiconductor elements 10a, 20a and the freewheeling diodes 10d, 20d are connected by bonding wires 10b, 20b and by metallizations 21 and 23. The electrical connection to additional semiconductor elements, diodes or other electronic components is made by means of conducting rails 11, 12, 13. Electrical contact is made with the conducting rails 11, 12, 13 in each of the areas shown hatched by means of the metallizations 21, 22, 23 lying under the conducting rails 11, 12, 13 in the direction of the substrate 6.

Unlike the diagrams of FIG. 8 and 9, a plurality of electronic and/or mechanical components can be combined into a unit on a common substrate 6, as shown in FIGS. 2 and 4 by way of example. Thus a plurality of such units can be arranged in a simple way on one metallization or on a plurality of metallizations of the substrate 6. The electrical connection to other similar units or other electronic components can in turn be made in a similar way using metallizations of substrates, using tracks of substrates and using conducting rails 11, 12, 13.

What is claimed is:

1. A semiconductor device comprising a first element and a second element of a half-bridge, having first, second, and third connecting leads, wherein
    the first element of the half-bridge comprises at least a first semiconductor element and a first freewheeling component,
    the second element of the half-bridge comprises at least a second semiconductor element and a second freewheeling component,
    the first connecting lead is connected by an electrically conducting connection to the first semiconductor element, and the second connecting lead is connected to the second semiconductor element,
    the first connecting lead and the second connecting lead are used for DC supply and are arranged parallel to each other, at least in parts,
    the third connecting lead constitutes a load terminal of the half-bridge,
    the first, second and third connecting leads each have a base point facing a substrate, and wherein
    connecting a first hypothetical line between centroids of the base points of the first and third connecting leads, and a second hypothetical line between the centroids of the base points of the second and third connecting leads enclose an angle greater than 0° and less than or equal to 20°.

2. A semiconductor device according to claim 1, wherein a third hypothetical line between centroids of the first semiconductor element and the first freewheeling component, and a fourth hypothetical line between centroids of the second semiconductor element and the second freewheeling component enclose an angle of 20° maximum.

3. A semiconductor device according to claim 1, wherein the first connecting lead encloses the second connecting lead, at least in parts, in an angle of at least 180°.

4. A semiconductor device according to claim 1, wherein the first connecting lead and the second connecting lead are arranged, at least in parts, coaxially with each other.

5. A semiconductor device according to claim 1, wherein at least one of the connecting leads has a planar design.

6. A semiconductor device according to claim 1, wherein the distance between the first connecting lead and the second connecting lead is less than 3.0 mm.

7. A semiconductor device according to claim 1, wherein at least one of the semiconductor elements is designed as an IGBT or a MOSFET.

8. A semiconductor device according to claim 1, wherein part of the third connecting lead is sandwiched between the first and second semiconductor elements, and is electrically connected to them by an electrically conducting connection.

9. The semiconductor device of claim 1 wherein the first semiconductor element is connected electrically in parallel with the first freewheeling component and the second semiconductor element is connected electrically in parallel with the second freewheeling component.

10. The semiconductor device according to claim 9, wherein the first and second connecting leads of the first and second semiconductor elements run at least in parts parallel to each other.

11. A semiconductor module having a first semiconductor device and a second semiconductor device which are arranged on a common substrate and connected electrically in parallel, wherein the common substrate comprises for each semiconductor device:
a first element arranged on the common substrate comprising at least a first semiconductor element and a first freewheeling component,
a second element arranged on the common substrate comprising at least a second semiconductor element and a second freewheeling component,
a first connecting lead coupled by an electrically conducting connection with the first semiconductor element, and a second connecting lead coupled with the second semiconductor element, wherein the first and second connecting leads are at least partly arranged in parallel to each other, and
a third connecting lead, wherein the first, second and third connecting leads each have a base point facing the common substrate, and wherein a first hypothetical connecting line between centroids of the base points of the first and third connecting leads, and a second hypothetical connecting line between the centroids of the base points of the second and third connecting leads enclose an angle of greater than 0° and less than or equal to 20°.

12. The semiconductor module according to claim 11, wherein the two first connecting leads and the two second connecting leads form a pair, respectively; wherein the pairs are arranged crosswise, and the connecting leads of the same pair have the same polarity.

13. The semiconductor module according to claim 11, comprising at least one first, second and third conducting rail for connecting the semiconductor devices electrically in parallel, wherein the connecting leads and/or electrical connections required for the parallel circuit are implemented by the at least one first, second and third conducting rail.

14. A semiconductor module according to claim 13, wherein at least the first and second conducting rails run parallel to each other.

15. A semiconductor module according to claim 14, wherein the third conducting rail runs parallel to the first and second conducting rails, and wherein each of the semiconductor elements is arranged between the third conducting rail and the pair of the first and second conducting rails.

16. A semiconductor device having a half-bridge arranged on a common substrate comprising
a first element arranged on the common substrate comprising at least a first semiconductor element and a first freewheeling component,
a second element arranged on the common substrate comprising at least a second semiconductor element and a second freewheeling component,
a first connecting lead coupled by an electrically conducting connection with the first semiconductor element, and a second connecting lead coupled with the second semiconductor element, wherein the first and second connecting leads, are at least partly arranged in parallel to each other, and
a third a first hypothetical connecting lead, wherein the first, second and third connecting leads each have a base point facing the common substrate, and wherein a second hypothetical connecting line between centroids of the base points of the first and third connecting leads, and a connecting line between the centroids of the base points of the second and third connecting leads enclose an angle of greater than 0° and less than or equal to 20°.

17. A semiconductor device according to claim 16, wherein a third hypothetical connecting line of centroids of the first semiconductor element and the first freewheeling component, and a fourth hypothetical connecting line of centroids of the second semiconductor element and the second freewheeling component enclose an angle of 20° maximum.

18. A semiconductor device according to claim 16, wherein the first connecting lead encloses the second connecting lead, at least in parts, in an angle of at least 180°.

19. A semiconductor device according to claim 16, wherein the first connecting lead and the second connecting lead are arranged, at least in parts, coaxially with each other.

20. A semiconductor device according to claim 16, wherein at least one of the connecting leads has a planar design.

* * * * *